(12) United States Patent
Takahashi

(10) Patent No.: US 7,653,780 B2
(45) Date of Patent: Jan. 26, 2010

(54) SEMICONDUCTOR MEMORY DEVICE AND CONTROL METHOD THEREOF

(75) Inventor: Hiroyuki Takahashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 387 days.

(21) Appl. No.: 10/849,906

(22) Filed: May 21, 2004

(65) Prior Publication Data

US 2004/0240288 A1 Dec. 2, 2004

(30) Foreign Application Priority Data

May 26, 2003 (JP) ............................. 2003-147504

(51) Int. Cl.
G06F 12/00 (2006.01)
G06F 13/00 (2006.01)
G06F 13/28 (2006.01)
G11C 7/00 (2006.01)
G11C 7/10 (2006.01)
G11C 8/00 (2006.01)

(52) U.S. Cl. ................. 711/106; 711/105; 711/118; 365/189.011; 365/189.04; 365/222; 365/230.03; 365/230.04; 365/230.05; 365/233.1

(58) Field of Classification Search ......... 711/105–106, 711/118; 365/202, 189.01, 189.04, 222, 365/230.03–230.05, 233

See application file for complete search history.

(56) References Cited

U.S. PATENT DOCUMENTS

| | | | | |
|---|---|---|---|---|
| 5,721,862 A | * | 2/1998 | Sartore et al. ............. | 711/118 |
| 6,222,786 B1 | * | 4/2001 | Holland et al. ............ | 365/222 |
| 6,510,098 B1 | * | 1/2003 | Taylor .................. | 365/230.05 |
| 6,546,461 B1 | * | 4/2003 | Au et al. ................ | 711/131 |
| 6,697,909 B1 | * | 2/2004 | Wang et al. ............... | 711/106 |
| 6,762,973 B2 | * | 7/2004 | Shu et al. ................ | 365/233 |
| 6,854,041 B2 | * | 2/2005 | Covino et al. ............ | 711/167 |
| 6,941,415 B1 | * | 9/2005 | Ryan ..................... | 711/106 |

(Continued)

FOREIGN PATENT DOCUMENTS

JP 59-129989 7/1984

(Continued)

OTHER PUBLICATIONS

"QDR SRAM-The High Bandwidth SRAM Family", <URL:http://www.qdrsram.com>, May 2, 2003.

(Continued)

Primary Examiner—Sanjiv Shah
Assistant Examiner—Yaima Campos
(74) Attorney, Agent, or Firm—McGinn IP Law Group, PLLC

(57) ABSTRACT

A semiconductor memory device that does not delay read/write access due to a refresh and can be interface compatible with a high-speed SRAM such as a QDR SRAM, comprises a plurality of subarrays each having a plurality of dynamic memory cells; at least one cache memory for the plurality of subarrays; a circuit to check whether data read from the subarray selected by a read address is present in the cache memory or not; and a circuit performing control so that the check result indicates that the data is present in the cache memory, the data is read from the cache memory and refreshing of the subarray is performed concurrently with a read cycle.

8 Claims, 13 Drawing Sheets

U.S. PATENT DOCUMENTS

| | | | |
|---|---|---|---|
| 2002/0067650 A1* | 6/2002 | Tanaka et al. | 365/222 |
| 2002/0093865 A1* | 7/2002 | Agata | 365/222 |
| 2003/0033492 A1* | 2/2003 | Akiyama et al. | 711/156 |
| 2003/0063515 A1* | 4/2003 | Jain | 365/230.05 |
| 2003/0065884 A1* | 4/2003 | Lu et al. | 711/118 |

FOREIGN PATENT DOCUMENTS

| | | |
|---|---|---|
| JP | 3-17889 | 1/1991 |
| JP | 7-45062 | 2/1995 |
| JP | 8-273350 | 10/1996 |
| JP | 9-180437 | 7/1997 |
| JP | 10-228766 | 8/1998 |
| JP | 11-86532 | 3/1999 |
| JP | 2001-283587 | 10/2001 |
| JP | 2002-216479 | 8/2002 |
| JP | 2002-313082 | 10/2002 |

OTHER PUBLICATIONS

John L. Hennesy and David A. Patterson, "Computer Organization and Design", 7.2 Caches, p. 463, 1994.

Japanese Office Action dated Apr. 11, 2006 with partial English translation.

* cited by examiner

SEMICONDUCTOR MEMORY DEVICE AND CONTROL METHOD THEREOF

FIELD OF THE INVENTION

The present invention relates to a semiconductor memory device. More specifically, the invention relates to a dynamic semiconductor memory device suitable for being applied to an SRAM semiconductor memory device and its control method.

BACKGROUND OF THE INVENTION

Quad Data Rate (QDR™) SRAM devices, which are high performance SRAMs used for communication applications and the like include separate data input and data output buses, and include separate/concurrent read and write ports. With respect to the latest information on the QDR SRAM, the following Nonpatent Document 1 and the like are referred to. QDR is a trademark of CYPRESS, HitaCHIT, IDT, Micron, NEC, and Samsung.

While a DRAM (dynamic random access memory) device requires a periodic refresh operation and a pre-charge operation of a bit line, a SRAM device is excellent in terms of a data access cycle. On the other hand, in the SRAM device, each cell is composed by four transistors (two selection transistors connected to a pair of bit lines and two transistors with their gates and drains cross-connected to each other in the case of a high resistive load type cell) or six transistors (in the case of an active element load type). The memory cell in the DRAM device is composed by one transistor and one capacitor, for example. A DRAM is superior to an SRAM in terms of a chip area, power dissipation, and a cost. Thus, there is proposed the DRAM which aims at improvement in device integration, power dissipation, and the cost while providing advantages of a conventional ZBT (zero bus turnaround) SRAM device having similar pin outs, timing and function set to those of the SRAM (refer to the following Patent Document 1, for example). The Patent Document 1 described an object of providing the enhanced bus turnaround DRAM with pinouts, the timing, and function sets similar to those of the ZBT SRAM device and having same advantages as the ZBT SRAM device. The device, however, is not ZBT-SRAM compatible. More specifically, the memory device described in the above-mentioned Patent Document 1 includes a WAIT terminal for informing a controller provided outside the memory device that a memory array is in a state where it cannot be used for data access. In a refresh cycle, read/write operations must be interrupted. The Patent Document 1 discloses a configuration in which an SRAM memory (or an SRAM cache) is provided for a (DRAM) memory array as a row cache.

There are also known a method and a device in which a read and a write are performed in succession in a same cycle (refer to the following Patent Document 2, for example). These method and device utilizes an advantage that, by employing a data input bus and a data output bus in a separate I/O DDR (Double Data Rate) or QDR RAM, a data rate can be doubled or increased more in a same cycle time. When the device receives a read command in one cycle, a step of performing a read operation in synchronization with a clock signal and a step of performing a write operation in synchronization with a signal that operates during the read is executed in one cycle. There is further known a configuration that includes an SRAM array connected to a DRAM memory via a transfer circuit (refer to the following Patent Document 3, for example). As a general configuration of a known cache memory that will be described later, the following Non-Patent document 2 and the like are referred to.

[Nonpatent Document 1]

"QDR SRAM—The High Bandwidth SRAM Family" Internet (searched on May 2, 2003) <URL:http://www.qdrsram.com/>

[Nonpatent Document 2]

John. L. Hennesy and David A. Patterson. "Computer Organization and Design", 7.2 Caches, p463, Morgan Kaufmann Publihshers Inc. 1994.

[Patent Document 1]

Japanese Patent Kokai Publication No. JP-P2001-283587A (p. 2, FIG. 1)

[Patent Document 2]

Japanese Patent Kokai Publication No. JP-P2002-313082A (p. 6, FIG. 3)

[Patent Document 3]

Japanese Patent Kokai Publication No. JP-A-11-86532 (p. 4, FIG. 1)

SUMMARY OF THE DISCLOSURE

In the QDR SRAM used for the communication application and the like, a read and a write are alternately performed when continuous accesses are made. When a memory array compliant with this QDR specification is constituted from a DRAM array, a delay such as a wait occurs during read and write accesses due to insertion of a refresh period, which becomes a factor for inhibiting a higher speed of a bus cycle.

Accordingly, it is an object of the present invention to provide a novel semiconductor memory device that is interface compatible with a high-speed SRAM, compliant with specifications in which a periodic read access is performed or alternate read and write accesses are performed, for example, and a control method of the semiconductor memory device.

The above and other objets are attained by a semiconductor memory device according to one aspect of the present invention for achieving the object described before includes a cache memory in a cell array having dynamic memory cells and performs refreshing at the time of reading cached data. The present invention includes a plurality of subarrays each having a plurality of dynamic memory cells, includes at least one cache memory for the plurality of subarrays, determines whether data read from one of the subarrays using a read address is present in the cache memory. The present invention is configured to perform control so that when the data is present in the cache memory, the data is read from the cache memory and refreshing of the subarray is performed concurrently with reading of the data from the cache memory.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Embodiments of the present invention will be described in the below. In a semiconductor memory device compliant the QDR specification, a cell array is operated by a half clock in burst 2, and by one clock in burst 4. The cell array, comprised of plural DRAM cells each having two transistors, can be operated using a clock cycle twice of the cycle of a clock signal used for synchronization. Further, u sing a read-system port and a write-system port, read and write operations can be executed concurrently.

In one embodiment of the present invention, in order to hide a refresh, a cache memory is provided for the read-system port. Even if continuous accesses (alternate read and write accesses) to a sub-array, the sub-array is refreshed when a cache hits. With this arrangement, the present invention becomes compatible with the QDR SRAM specification.

In one embodiment of the present invention, as a measure for concurrently executing a read operation and a write operation at the time of the same word lines being selected, that is, when the row address of a selected address of the read-system port and the row address of a selected address of the write-system port match each other, the timing of writing data to a selected cell through the write-system port is shifted from the timing of reading through the read-system port, or writing of data to a selected cell through the write-system port is performed in preference. Alternatively, control is performed so that a sense amplifier for the read-system port is deactivated, and data in the selected cell is output to a read bus through a Y switch, and only a sense amplifier for the write-system port is activated.

Further, in another embodiment mode of the present invention, the cell array is composed by DRAM cells each having one transistor per cell. The cache memory is provided for the read-system port, and even if continuous accesses (alternate read and write accesses) last, the memory cell is refreshed when a cache hit. In this embodiment, by providing the cache memory for each subarray, the semiconductor memory device of the invention becomes compatible with the QDR SRAM specification.

Figure 1:
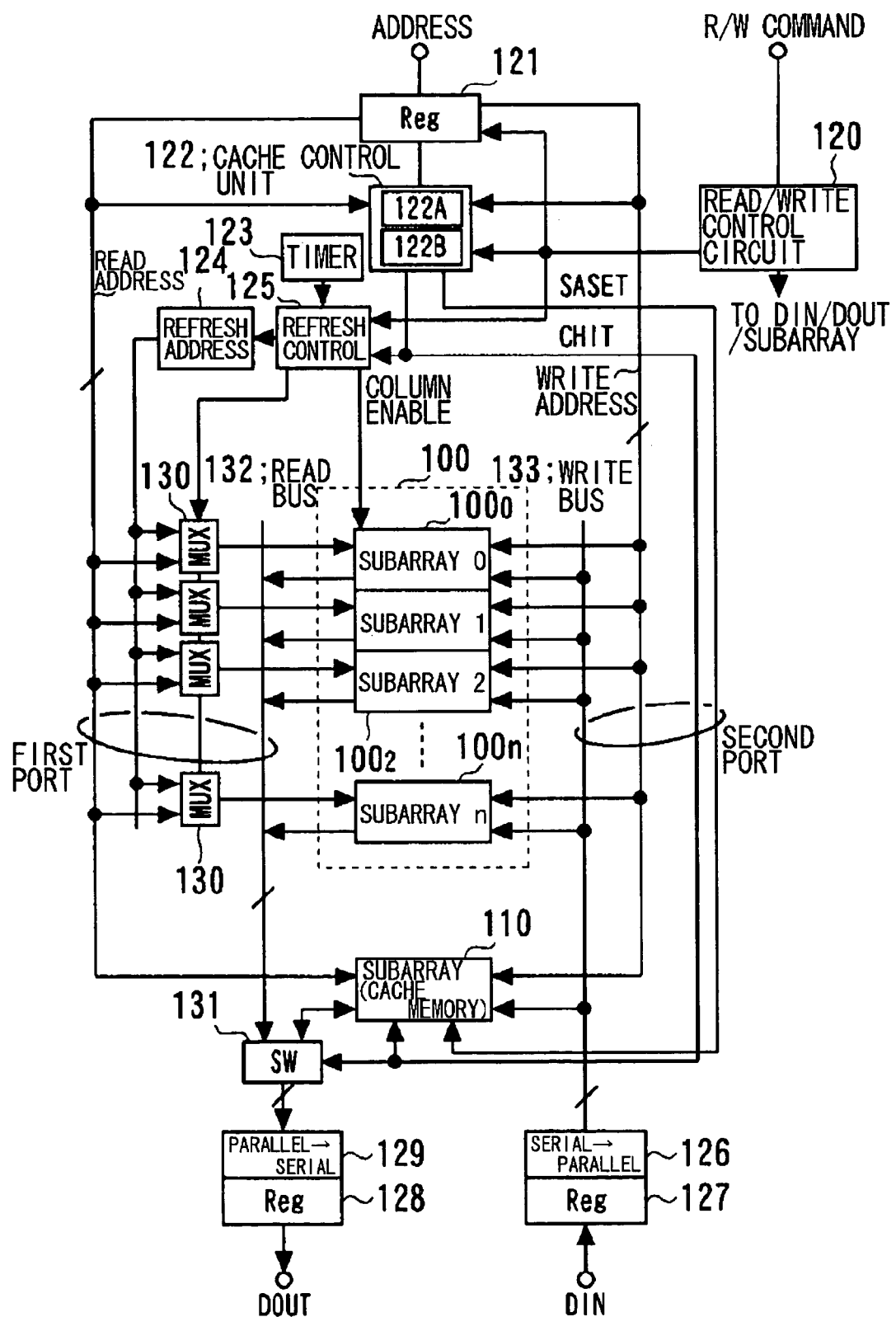
FIG. 1 is a diagram showing a configuration of a cell array in a semiconductor memory device according to an embodiment of the present invention and the entire semiconductor memory device.

The embodiment of the present invention will be described in detail below with reference to drawings. FIG. 1 is a diagram showing a configuration of a semiconductor memory device in accordance with an embodiment of the present invention. A subarray is composed by two-port DRAM cells. This semiconductor memory device is suitable for being interface compatible with a clock synchronous type SRAM compliant with the QDR (Quad Data Rate) specifications and the like.

Referring to FIG. 1, in the semiconductor memory device according to the present embodiment, a normal cell area 100 includes a plurality of subarrays $100_0$ to $100_n$. In addition to the subarrays, the semiconductor memory device includes a cache memory 110. Each of sub-arrays $100_0$ to $100_n$ is composed by a two-port DRAM array. Of the two ports, a first port is a read-system port, and either of a read address and a refresh address is selected by a multiplexer 130 for input. Read data is output to a read bus 132. During a normal operation, the multiplexer 130 selects a read address (row address) from a register 121, and during a refresh operation, the multiplexer 130 selects a refresh address. A second port is a write-system port, to which a write address from the register 121 and write data from a write bus 133 are supplied. In this embodiment, a cache memory 110 is constituted from an SRAM array and requires no refreshing.

Each of the subarrays $100_0$ to $100_n$ is composed by a two-port DRAM array, each of which includes X decoders of a first system and a second system (row decoders for decoding the row address of an address signal), word lines of the first system and the second system, bit lines of the first system and the second system, and sense amplifiers of the first system and the second system, all of which are not shown.

Further, in this embodiment, first and second Y decoders, not shown (column decoders for decoding the column address of the address signal) for two ports of a read system and a write system are provided in common to the plurality of subarrays $100_0$ to $100_n$.

The register 121 temporarily holds the address signal supplied at an address terminal not shown.

A read/write control circuit 120 receives a read/write command output from a command register not shown and performs control over a read/write operation on a subarray (e.g. read enable/write enable control over a cell array). The read/write control circuit 120 controls input of write data from a data input terminal DIN and output of read data from a data output terminal DOUT, both of which are associated with the read/write operation.

In this embodiment, a read (R) and a write (W) are alternatively supplied as read and write commands continuously supplied to the read/write control circuit 120.

A cache control unit 122 receives a write address and a read address output from the register 121 and a control signal from the read/write control circuit 120, and outputs a cache hit signal CHIT indicating data for read access hits data in the cache memory 110 and a signal SASET for resetting the cache memory 110 when a subarray to be accessed is switched to another subarray.

The cache control unit 122 includes a tag storing unit 122A and a comparator 122B. The tag storing unit 122A stores a tag address constituted from a bit field that is part of an address, data of which has been stored in the cache memory 110. The comparator 122B compares a read address output from the register 121 and address information stored in the tag storing unit 122A and outputs the cache hit signal CHIT in an active state when they match. The tag-storing unit 122A is constituted from an SRAM, for example.

In this embodiment, in the subarrays $100_0$ to $100_n$ (with a same memory capacity) and the cache memory 110, an address space defined by a difference between the starting address and the ending address of the cache memory 110 is set to be the same as an address space defined by a difference between the starting address and the ending address of one subarray. In this case, the high-order bit field of an access address signal may be set to subarray selection bits for selection among the subarrays 0 to n (when n is 15, the high-order four bits of the address signal are employed as a signal for making selection among 16 subarrays). Predetermined low-order bits may be set to the column address and the row address of a subarray, and the column address and the row address may be stored in the tag storing unit 122A as tag address information. The address space of the cache memory 110 may be set to be larger than the address space of the subarray. Further, tag addresses may be sequentially stored in the tag-storing unit, and data may be stored in positions in the cache memory 110 corresponding to the tag addresses. In this case, the cache memory 110 may be configured to be a known cache constituted from a tag unit for storing the tag addresses and a data unit for storing data (refer to Nonpatent Document 2, for example).

A refresh timer 123 periodically outputs a refresh pulse according to a cell leak characteristic of DRAM memory cells.

A refresh control circuit 125 receives a control signal indicating a read operation or a write operation from the read/write control circuit 120, the cache hit signal CHIT output from the cache control unit 122, and a refresh signal from the refresh timer 123. When the refresh control circuit 125 has received the refresh signal from the refresh timer 123 and if the subarray to be refreshed is not selected, the refresh control circuit 125 performs a refresh operation through the read-system port, based on a refresh address from a refresh address generation circuit 124. When the refresh operation coincides with a read operation of a selected subarray through the read port, the refresh control circuit 125 causes the refresh operation of the subarray to stand by.

The refresh control circuit 125 commands the refresh address generation circuit 124 to output a refresh address when a cache hit has been determined based on a read address obtained from a read request for a subarray, and outputs a selection control signal to the multiplexer 130 so that the multiplexer 130 selects the refresh address. Further, the refresh control circuit 125 switches off a column enable signal, thereby turning off a column decoder for the read system at the time of the refresh operation (because the refresh address is composed by the row address alone) and turns off a Y switch for the read system in the subarray so that cell data read by a sense amplifier during the refresh operation is not output to the read bus 132.

A first terminal (input terminal) of a switch 131 is connected to the read bus 132, and a second terminal (input/output terminal) of the switch 131 is connected to a bi-directional bus connected to the cache memory 110. The switch 131 receives the cache hit signal CHIT from the cache control unit 122 at its control terminal as a selection control signal, and performs switching control for outputting the signal of the first terminal or second terminal based on the value of the selection control signal. More specifically, in case of cache hit (when the cache hit signal CHIT is active), the switch 131 outputs data stored in the cache memory 110 to a parallel-to-serial converter 129 as read data. In case a cache miss occurs (when the cache hit signal CHIT is inactive), the switch 131 outputs data read to the read bus 132 from a subarray based on a read address to the parallel-to-serial converter 129, and writes the readout data in the cache memory 110 using the read address. Then, the tag address information of the read address is stored in the tag-storing unit 122A of the cache control unit 122.

Two pieces of data per clock cycle are input from a data input terminal DIN in synchronization with rising and falling edges of a clock signal, held in a register 127, converted to parallel data by a serial-to-parallel converter 126, and output to the write bus 133. Write data is simultaneously written at the same addresses of the cache memory and a selected subarray. For burst 2, two pieces of serial data are converted to two-bit parallel data; for burst 4, four pieces of serial data are converted to four-bit parallel data.

The parallel data read to the read bus 132 is multiplexed into serial data by the parallel-to-serial converter 129, sampled by a register 128, and output from a data output terminal DOUT in synchronization with the clock signal. For burst 2, two-bit parallel data is converted to two bits of serial data; for burst 4, four-bit parallel data is converted to four bits of serial data.

Figure 4:
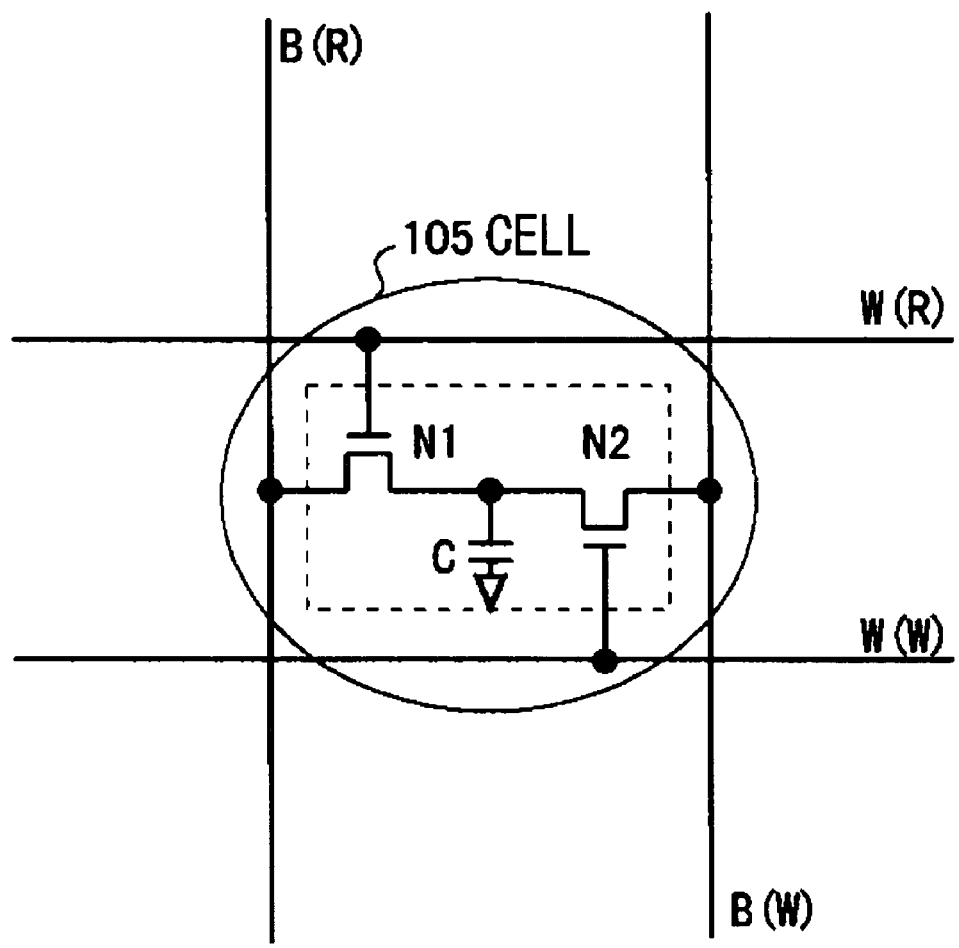
FIG. 4 is a diagram showing a configuration of a cell according to the embodiment of the present invention.

As shown in FIG. 4, one memory cell 105 of a subarray of a two-port configuration includes two cell transistors (N1 and N2) connected in series between a bit line B(W) for the write system and a bit line B(R) for the write system. To a connection node at which first and second cell transistors (N1 and N2) is connected the storage node of a capacitance element C for data storage. Gate terminals of the first and second cell transistors (N1 and N2) are connected to a word line W(R) for the read system and a word line W(W) for the write system, respectively.

An overview of an operation of the embodiment shown in FIG. 1 will be described. Using the timer 123, a periodic self-refresh is performed for each subarray. When a read operation coincides with a refresh operation, the read operation (reading from the cache memory 110 at the time of a cash hit) is started, and the refresh is waited for. The address space of the subarray is set so that a refresh waiting time is within the period of holding cell data.

When a subarray is continuously accessed (or alternate write and read accesses are performed), write data is written into a subarray associated with the write data and the cache memory 110. The tag address information of the write address is stored in the tag-storing unit 122A of the cache control unit 122.

When a read address in the register 121 does not match the tag address information stored in the tag storing unit 122A at the time of a read operation, i.e., when a cache miss occurs, read data output to the read bus 132 from the subarray using the read address is supplied to the switch 131. The switch 131 receives the read data from the read bus 132 to output the read data to the parallel-to-serial converter 129 and also writes the read data in the cache memory 110 using the read address.

On the other hand, when the read access using a read address having a tag address that matches the tag address information stored in the tag storing unit 122A of the cache control unit 122 has been performed, the comparator 122B of the cache control unit 122 makes the cache hit signal CHIT active, so that reading data from the cache memory 110 is performed. The switch 131 selects data from the cache memory 110 and outputs the selected data to the parallel-to-serial converter 129. At this point, by the refresh control circuit 125 that received the cache hit signal CHIT in the active state, the subarray to be accessed is refreshed. Refreshing of the subarray is performed, using the refresh address from the refresh address generation circuit 124. At this point, the refresh control circuit 125 deactivates the column enable signal, so that a Y switch between a sense amplifier for the read system for the subarray and the read bus 132 is turned off.

The cache control unit 122 makes the SASET signal active when the subarray to be accessed is switched into other subarray. If there are 16 subarrays constituted from subarrays 0 to 15 and subarray selection is performed using the high-order four bits of an address, switching from the subarray 0 to the subarray 1 is performed due to an address change from 00h (hexadecimal) to 01h. The SASET signal is thereby made active. On receipt of the SASET signal in the active state, the cache memory 110 is reset. At this point, the cache control unit 122 resets the tag-storing unit 122A.

If continuous, alternate write/read accesses are not performed to a subarray, refreshing of the subarray may be performed during a free cycle in which the subarray is not selected.

On the other hand, when a subarray different from one subarray has been selected through the write-system port, refreshing of the one subarray may be performed.

Figure 2:
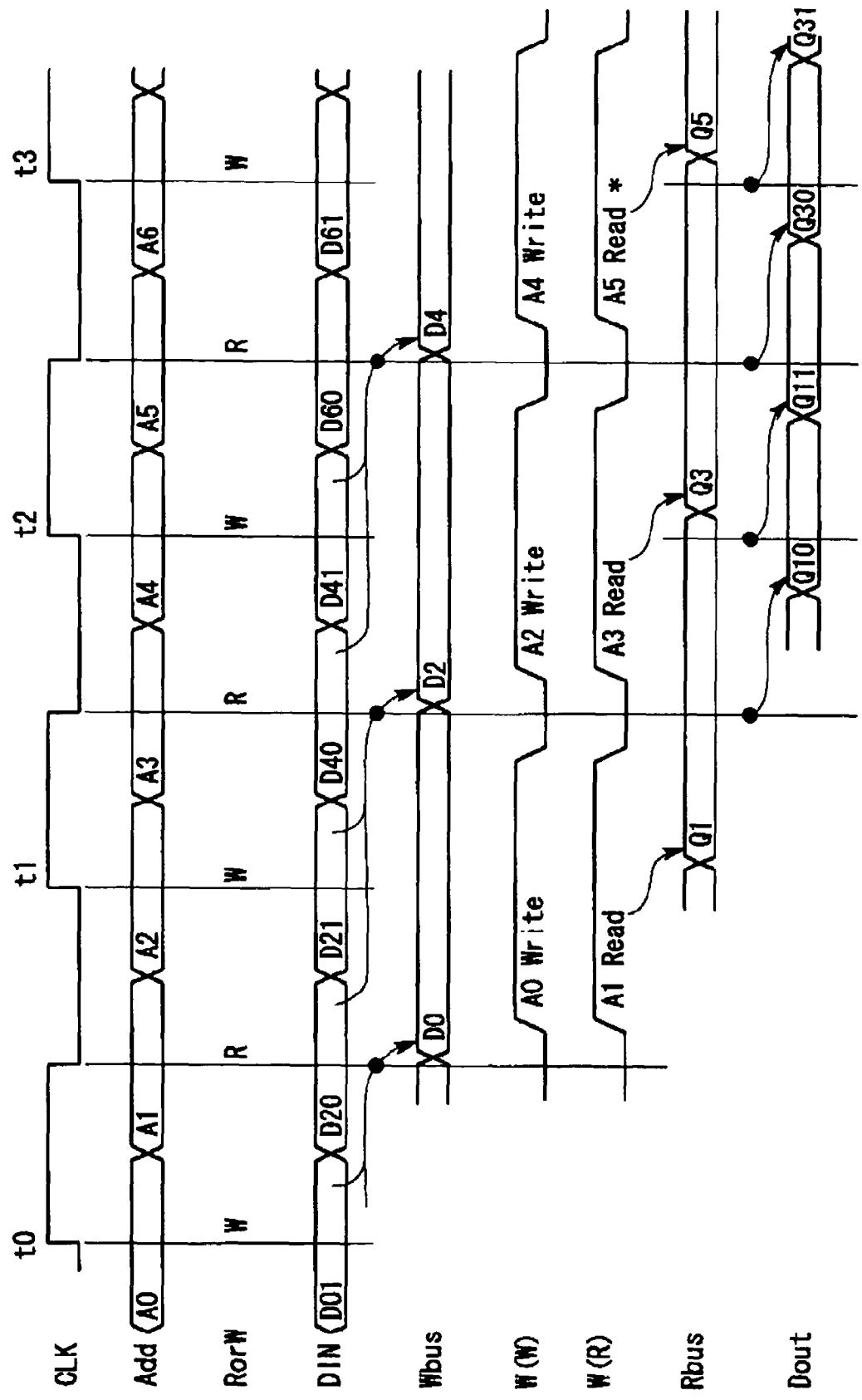
FIG. 2 is a timing diagram for explaining an example of an operation of the embodiment of the present invention (for QDR burst 2)

FIG. 2 is a diagram showing an example of an operation (compliant with the QDR burst 2 specification) of the embodiment of the present invention shown in FIG. 1. CLK denotes the clock signal input from the clock terminal of the semiconductor memory device, Add denotes the address signal input from the address terminal of the semiconductor memory device, RorW denotes a read/write command input to the read/write control circuit 120 (the read/write command being output from a command register not shown), DIN denotes data input to the data input terminal DIN, Wbus denotes the write bus 133, W(W) denotes a word line for the write system for a memory cell (refer to FIG. 4), W(R) denotes a word line for the read system for the memory cell (refer to FIG. 4), Rbus denotes the read bus 132, and Dout denotes data from the data output terminal DOUT.

Under the QDR burst 2 specifications, a cell array core performs a read operation or a write operation for each half cycle of the clock signal for synchronization. On contrast therewith, in this embodiment, the operating frequency of a cell array core is set to be halved, as shown in FIG. 2. That is, in the present embodiment, the read or write operation by the cell array core is performed using a period corresponding to one clock cycle, for example, in response to the read or write command issued for each half clock. With this arrangement, even if the cell array is constituted from the DRAM array, an operation speed seen from an outside can be made the same as that of an SRAM.

As shown in FIG. 2, using both rising and falling edges of the clock signal CLK, two data elements (such as D20 and D21) are input from the data input terminal DIN in one clock cycle, the read command or the write command is issued and an access address Add is input in a half clock cycle. For the following description, addresses A0 to A5 are set to belong to an identical subarray.

Two data elements D00 and D01 are output in parallel to the write bus 133 in one clock cycle, and the data elements D00 and D01 are written at the address A0 on the subarray (see "A0 Write" in W(W)). On this occasion, the data elements D00 and D01 are written to the cache memory 110 as well.

Next, reading data from the address A1 is performed (see "A1 Read"). During a clock cycle t1, readout data Q10 and Q11 from the address A1 are output to the read bus 132 in parallel. The Q10 and Q11 are serially output to the data output terminal Dout.

According to the present embodiment, the DRAM array of the two-port configuration is provided, so that a read operation and a write operation at the cell array core can be concurrently executed. A read cycle/write cycle can be therefore made one clock cycle. For this reason, a timing margin at the cell array core is mitigated, thereby enabling to accommodate an SRAM-compatible faster operation. In the present embodiment, as described before, when a cache hit is found in the cache memory 110 at the time of the read operation, data held in the cache memory 110 is output as readout data. If "A5 Read" at the read address A5 in FIG. 2 is set to "A1 Read" at the address A1, for example, a refresh address is input through the port for the read system for the associated subarray and a refresh operation is performed during the cycle marked "*" because the data at the address A1 is already written in the cache memory. In an example shown in FIG. 2, rise timings of the word line W(W) for the write system and the word line W(R) for the read system are set to be the same (as the timings of falling edges of the clock signal CLK). However, the rise timings of the word lines W(W) and W(R) may be shifted in such a manner that the rise timing of one of the word lines W(W) and the word line W(R) is set to the rise timing of the clock signal CLK, and the rise timing of the other word line is set to the fall timing of the clock signal CLK.

Figure 3:
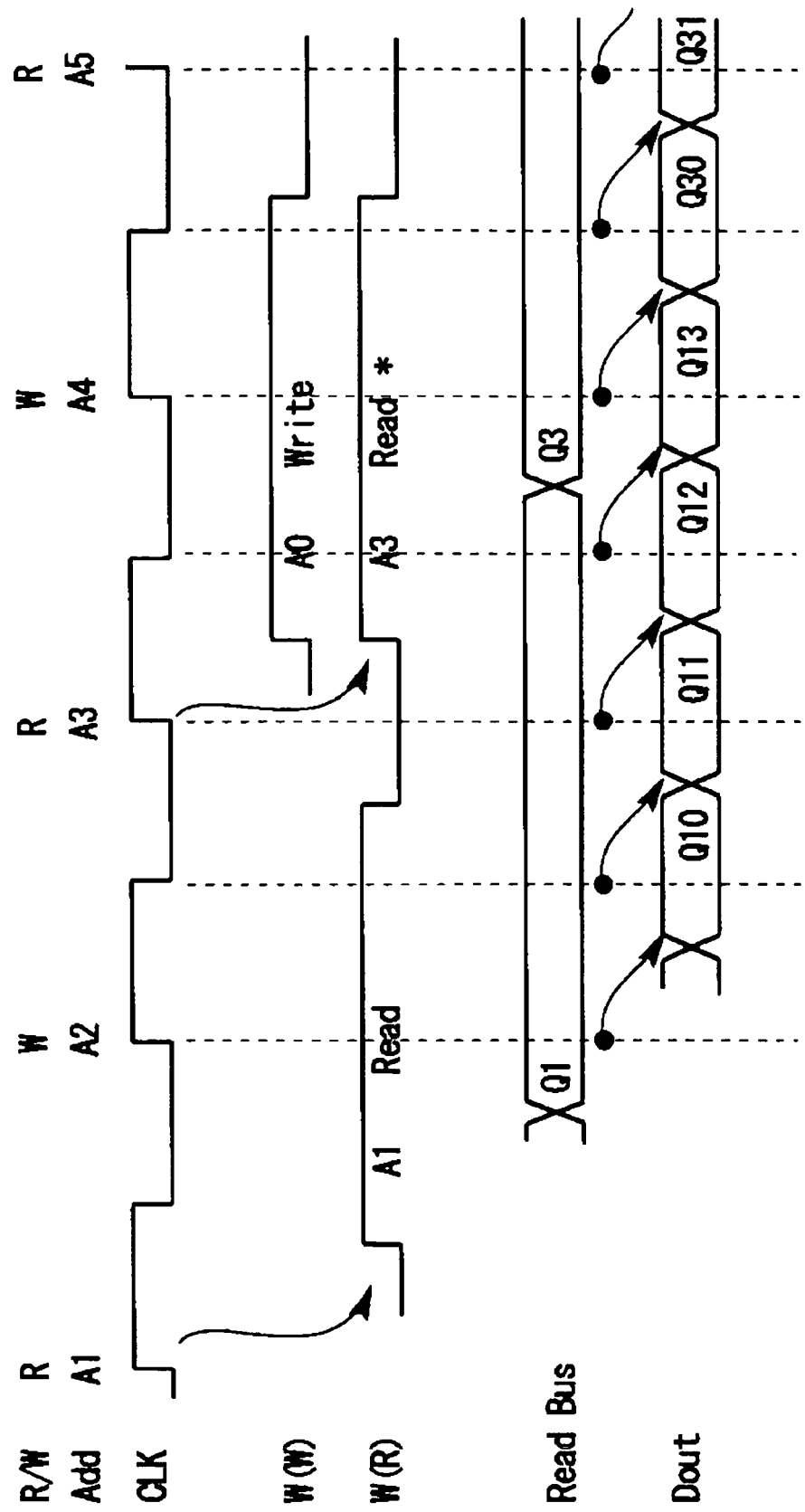
FIG. 3 is a timing diagram for explaining an example of an operation of another embodiment of the present invention (for QDR burst 4)

FIG. 3 is a diagram showing an example of the operation of QDR burst 4 according to another embodiment of the present invention. The configuration of the semiconductor memory device is set to the configuration shown in FIG. 1.

In the present embodiment, four pieces of data are serially input from the data input terminal DIN in two clock cycles and then output through the serial-to-parallel converter 126 as four-bit parallel data. Four pieces of data are serially output from the data output terminal Dout in two clock cycles. When the continuous, alternate read and write accesses are made, the read command and the write command are respectively issued for each clock cycle. At the cell array core in the subarray, a read operation and a write operation are performed over a two-clock cycle, which is four half-clock cycles. Further, since the subarray is configured to have two ports for the read system and the write system, as described before, the read operation and the write operation are alternately performed when the continuous, alternate read/write accesses are made. When the cache hit has been found at the address A3, the data in the cache memory is used as readout data. For the first port of the subarray, the two clock cycles are cycles for a refresh.

An example of a measure when concurrent read and write accesses have been made through the two ports for the read system and the write system of a subarray in the embodiment shown in FIG. 1 will be described below.

In the before-mentioned embodiment shown in FIG. 1, a two-port DRAM is employed as a cell. The read and write operations can be thereby performed in one clock rather than in a half clock, for example, and the internal operating frequency can be halved. However, the read operation and the write operation need to be executed in the same cycle. The same also holds true for the embodiment described before with reference to FIG. 3.

Figure 5:
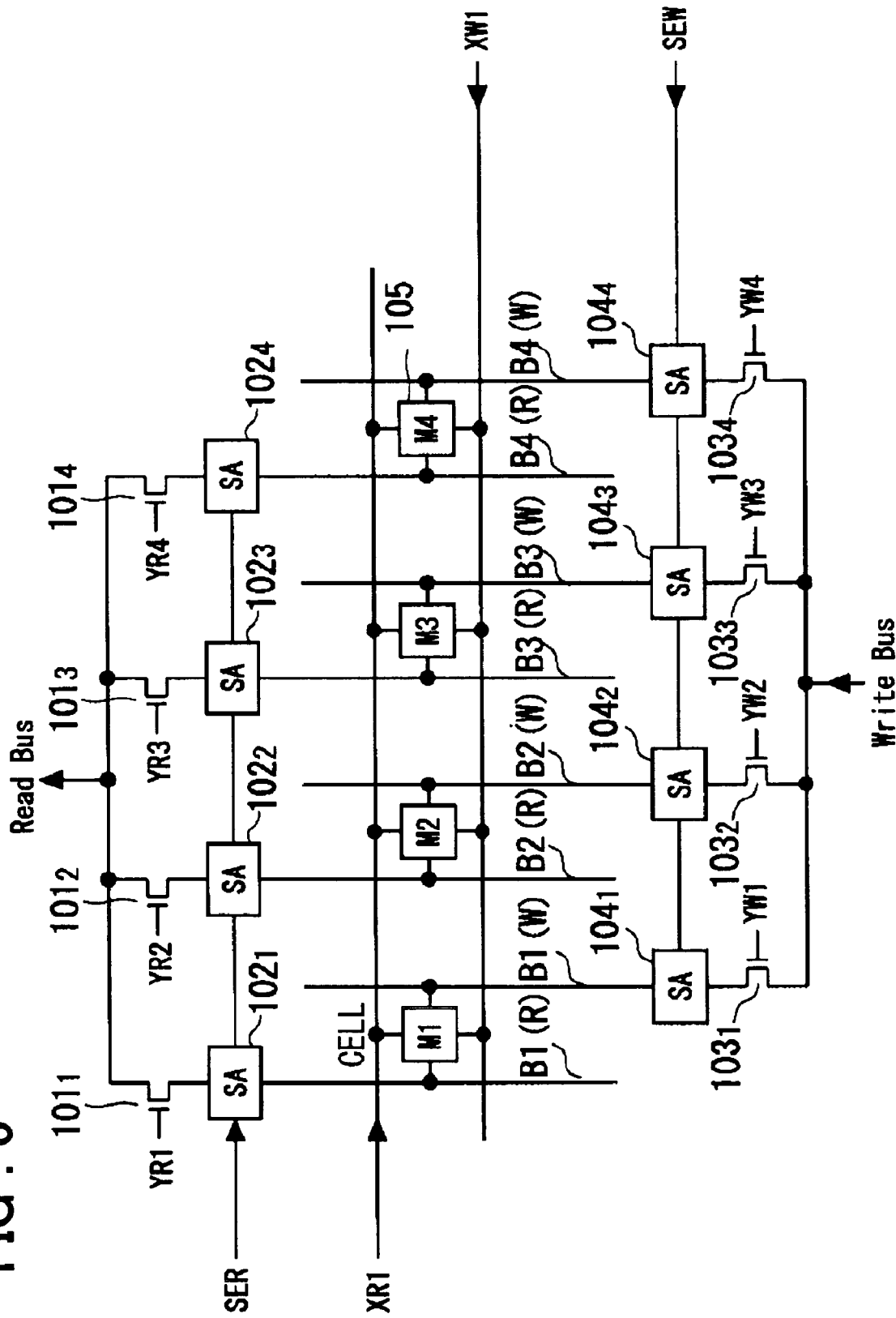
FIG. 5 is a diagram showing an example of a sub array according to the embodiment of the present invention.

A case where the same word lines have been selected for a read and a write will be described below with reference to FIG. 5 schematically showing a configuration of the subarray.

Referring to FIG. 5, memory cells 105 indicated by memory cells M1 to M4, respectively are configured as shown in FIG. 4. Each memory cell 105 includes the two cell transistors (N1 and N2) connected in series between the bit line B(W) for the write system and the bit line B(R) for the read system. The storage node of the capacitance element C for data storage is connected to the connection node at which the first and second cell transistors are connected. The gate terminals of the first and second cell transistors N1 and N2 are connected to the word line XR1 for the read system and the word line XW1 for the write system (refer to FIG. 5), respectively.

Referring to FIG. 5, Y switches (NMOS transistors) $101_1$ to $101_4$ on the side of the read-system port are connected between sense amplifiers $102_1$ to $102_4$ on the side of the read-system port and the read bus. The Y switches $101_1$ to $101_4$ are controlled to be turned on and off by column selection signals YR1 to YR4 supplied to their respective gate terminals. The sense amplifiers $102_1$ to $102_4$ for the read-system port are connected to bit lines B1(R) to B4(R) for the read system, respectively. Y switches (NMOS transistors) $103_1$ to $103_4$ for the write-system port are connected between sense amplifiers $104_1$ to $104_4$ for the write-system port and the write bus, and are controlled to be turned on and off by column selection signals YW supplied to their respective gate terminals. The sense amplifiers $104_1$ to $104_4$ for the write-system port are connected to bit lines B1(W) to B4(W) on the write side, respectively. Activation of the sense amplifiers $102_1$ to $102_4$ for the read-system port and activation of the sense amplifiers $104_1$ to $104_4$ for the write system are controlled by first and second sense amplifier activation signals SER and SEW, respectively.

Figure 6:
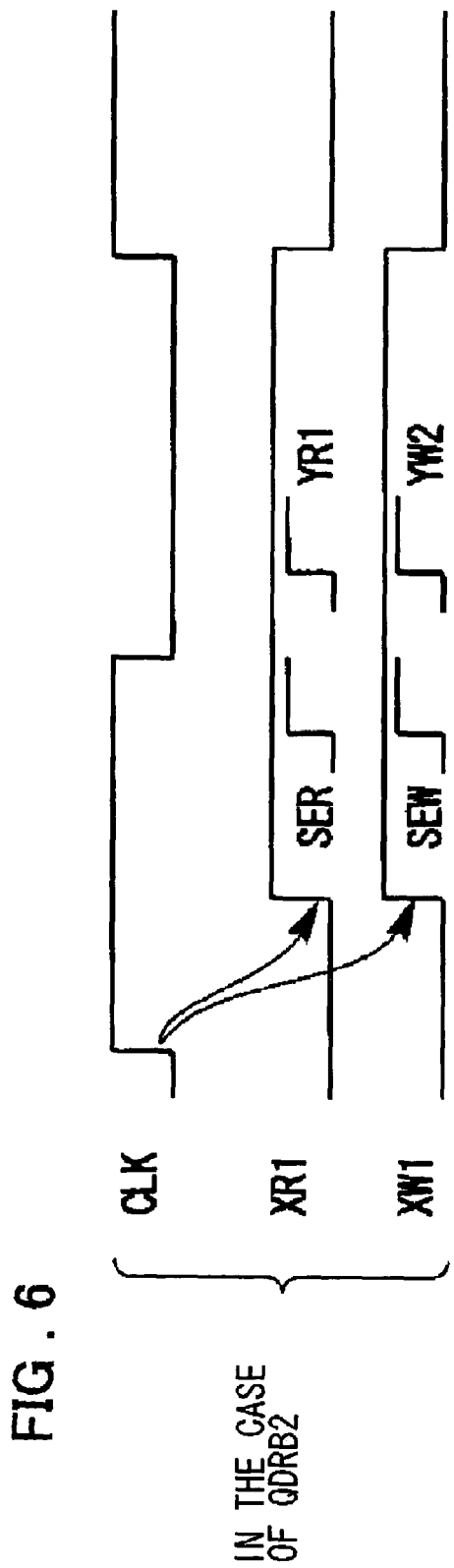
FIG. 6 is a diagram showing an example of an operation in connection with FIG. 5.

When the row address of an address selected through the read port (using the XR1 and the YR1) and the row address of an address selected through the write port (using the XW1 and a YW2) match each other, the XR1 and the XW1, which are selected word lines, are set to a high voltage after a predetermined time from the edge of the clock, as shown in a waveform diagram showing an example of QDR burst 2 in FIG. 6. Then, the first and second sense amplifier selection signals SER and SEW are made high, and the sense amplifier 102 for the read system and the sense amplifier 104 for the write system are activated. Then, the column selection signals YR1 and YW2 are made high, the Y switch $101_1$ and the Y switch $103_2$ are turned on. The sense amplifier $102_1$ is connected to the read bus, and the sense amplifier $104_2$ is connected to the write bus.

At this point, data to be written to the cell M2 through the Y switch $103_2$ that has been turned on by the column selection signal YW2 for the write system would collide with cell data to be restored by the sense amplifier $102_2$ for a read, connected to the Y switch $101_2$. When data held in the cell M2 is a logic one and data to be written to the cell M2 through the write-system port is a logic zero, the sense amplifier $102_2$ activated by the first sense amplifier activation signal SER restores data 1 into the cell M2, so that collision with data 0 to be written to the cell M2 through the write-system port occurs. The YR1 is made high, the Y switch $101_1$ is turned on, and reading of data in the cell M1 is performed. Thus, the operation of the read port cannot be stopped. Then, in the present embodiment, the following measure is taken against collision between data to be restored through the read-system port and data to be written through the write-system port.

Figure 7:
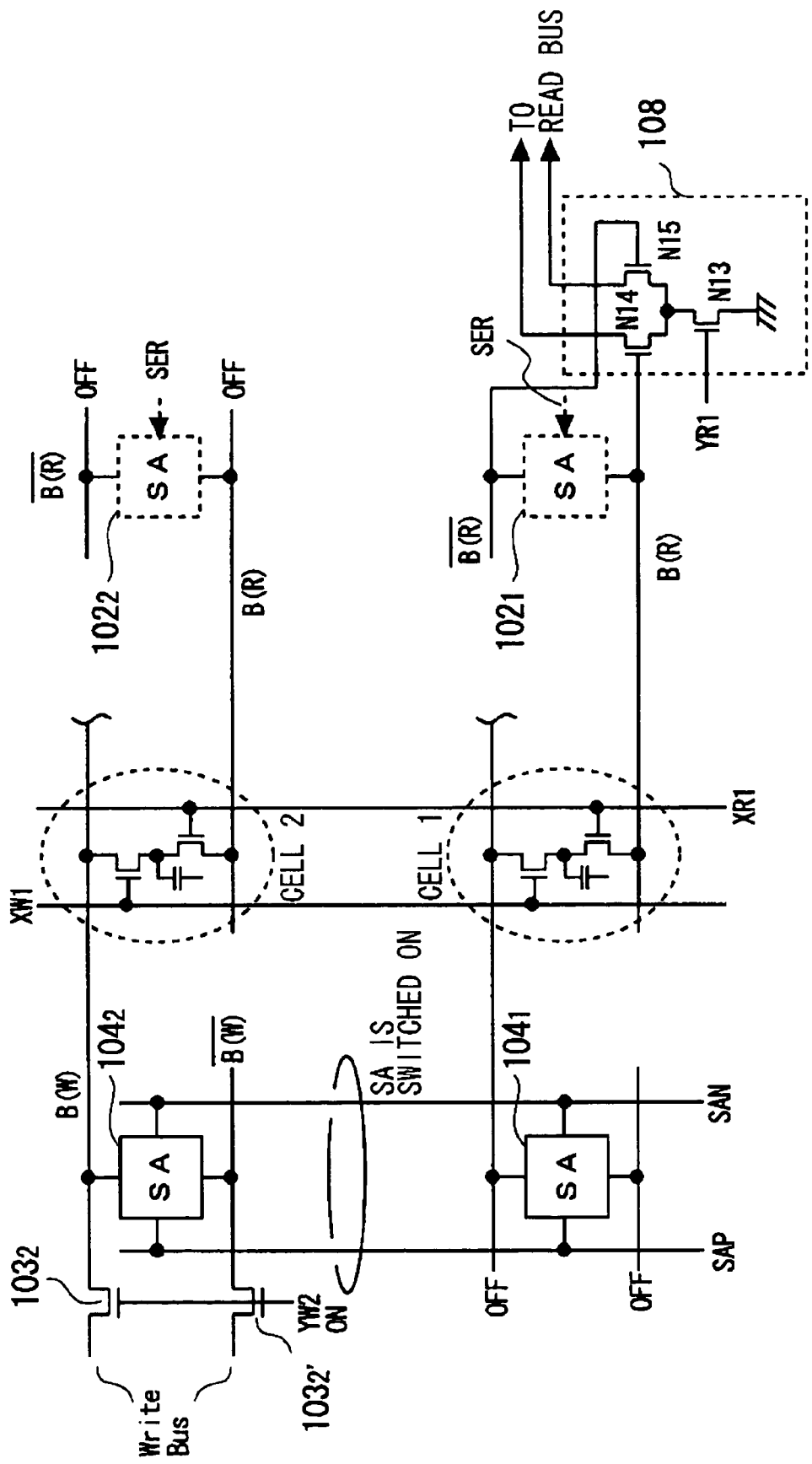
FIG. 7 is a diagram showing a measure directed toward concurrent execution of a read and a write when the same word lines have been selected, in the embodiment of the present invention.

In an embodiment of the present invention, when the row address for the read port matches the row address for the write port, control for preventing the sense amplifier on the side of the read-system port from being activated is performed. FIG. 7 is a diagram for explaining this embodiment.

Referring to FIG. 7, the word line XR1 for the read system is selected, the column selection signal YR1 for the read system is made high, the word line XW1 for the write system is selected, and the column selection signal YW2 for the write system is made high. At this point, the sense amplifiers $102_1$ and $102_2$ for the read-system port are deactivated (the sense amplifier activation signal SER in FIG. 5 is made low). The sense amplifier activation signal SEW (refer to FIG. 5) is made high, so that the sense amplifiers $104_1$ and $104_2$ for the write-system port are activated. The YW2 is made high, and through the Y switch $103_2$ in an on state, the write bus is connected to the complementary bit lines B(W) and /B(W) for the write system. Data is therefore written to the cell 2 connected to the selected word line XW1. The Y switch corresponding to the sense amplifier $104_1$ is turned off. Since the sense amplifier $102_2$ for the read-system port, connected to the cell 2 is deactivated, the sense amplifier $102_2$ for the read port will not hinder data writing to the cell 2 through the write-system port.

On the other hand, the sense amplifier $102_1$ for the read-system port for performing data reading from the cell 1 is deactivated because the first sense amplifier activation signal SER is turned off. Data reading is performed through a Y switch 108 for the read-system port. Incidentally, in this embodiment, the Y switches $101_1$ to $101_1$ for the read system in FIG. 5 are replaced by the Y switch 108 in FIG. 7.

Referring to FIG. 7, the Y switch 108 is composed by a differential pair circuit, activation of which is controlled by the column selection signal YR1. The Y switch 108 includes NMOS transistors N14 and N15 and an NMOS transistor N13. The NMOS transistors N14 and N15 constituting a differential pair, have their source coupled and gates for receiving differentially signals of bit line pair B(R) and /B(R) in the read system. The NMOS transistor N13 has its source grounded, has its drain connected to the coupled source of the NMOS transistors N14 and N15, and has its gate supplied with the column selection signal YR1. The NMOS transistor N13 constitutes a constant current source. The drains of the NMOS transistors N14 and N15 are connected to a differential read bus pair.

Restoration of data in the cell 1 is performed by the sense amplifier $104_1$ on the side of the write-system port, which is activated. In an example shown in FIG. 7, the bit line for the read system is constituted from a complementary pair of bit lines B(R) and /B(R), while the bit line for the write system is constituted from a complementary pair of bit lines B(W) and /B(W).

Figure 8:
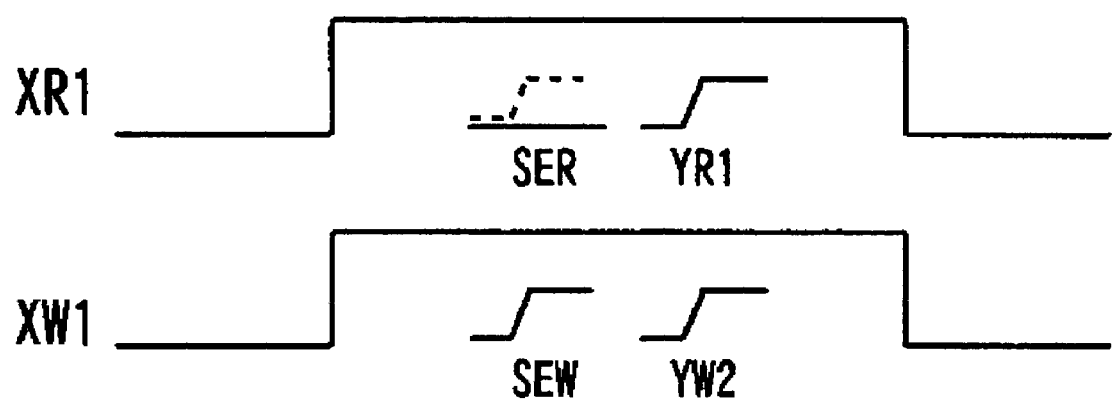
FIG. 8 is a diagram showing an example of an operation in connection with FIG. 7.

FIG. 8 is a signal waveform diagram showing an example of the operation of the embodiment shown in FIG. 7. The word line XR1 for the read-system port and the word line XW1 for the write-system port are selected. The first sense amplifier activation signal SER for controlling activation of sense amplifiers 102 for the read-system port is kept low. The second sense amplifier activation signal SEW for controlling activation of the sense amplifiers 104 for the write-system port is made high. Then, the column selection signal YR1 for the read-system port and the column selection signal YW2 for the write-system port are both made high.

Meanwhile, the first sense amplifier activation signal SER for controlling activation of the sense amplifiers 102 for the read-system port may be turned on, being delayed from the rise timing of the column selection signal YW2 for the write system.

Figure 9:
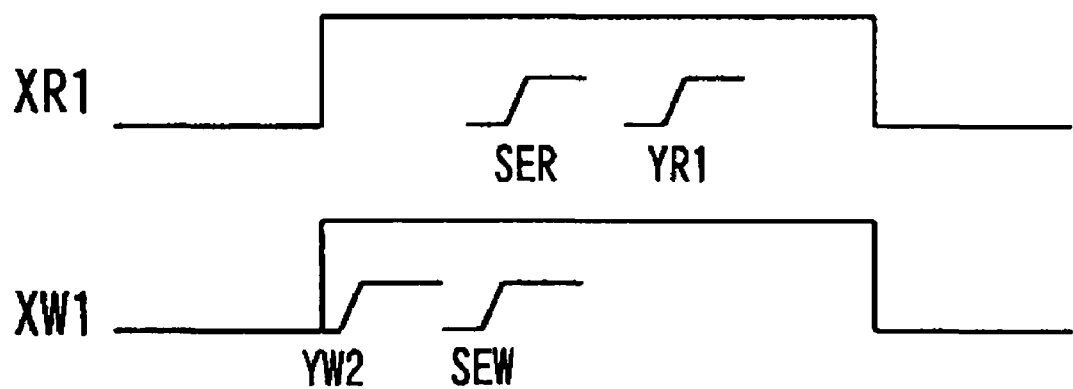
FIG. 9 is a timing diagram explaining a measure directed toward concurrent execution of a read and a write when the same word lines have been selected, in the embodiment shown in FIG. 5.

Next, another example of the measure when the row address for the read-system port matches the row address for the write-system port will be explained. In this example of the measure, the circuit configuration is set to the configuration shown in FIGS. 1 and 5, and the measure is directed toward timing control. FIG. 9 is a signal waveform diagram showing an operation of the present embodiment.

Referring to FIGS. 5 and 9, the word line XR1 for the read-system port and the word line XW1 for the write-system port are selected. Almost at the same time as rise of the word line XW1, the column selection signal YW2 for the Y switch $103_2$ for the write-system port is raised, and then the second sense amplifier activation signal SEW is raised.

On the other hand, the first sense amplifier activation signal SER for controlling activation of the sense amplifiers 102 for the read-system port rises, being delayed from the rise timing of the column selection signal YW2 for the write system. With this arrangement, before the sense amplifier activation signal SER for the read system is turned on, data in a selected cell is replaced by write data from the write-system port. It means that disturbance by data restoration of the sense amplifier $102_2$ for the read-system port on the write operation is eliminated. Meanwhile, there is no change in the operation of the read-system port.

Figure 10:
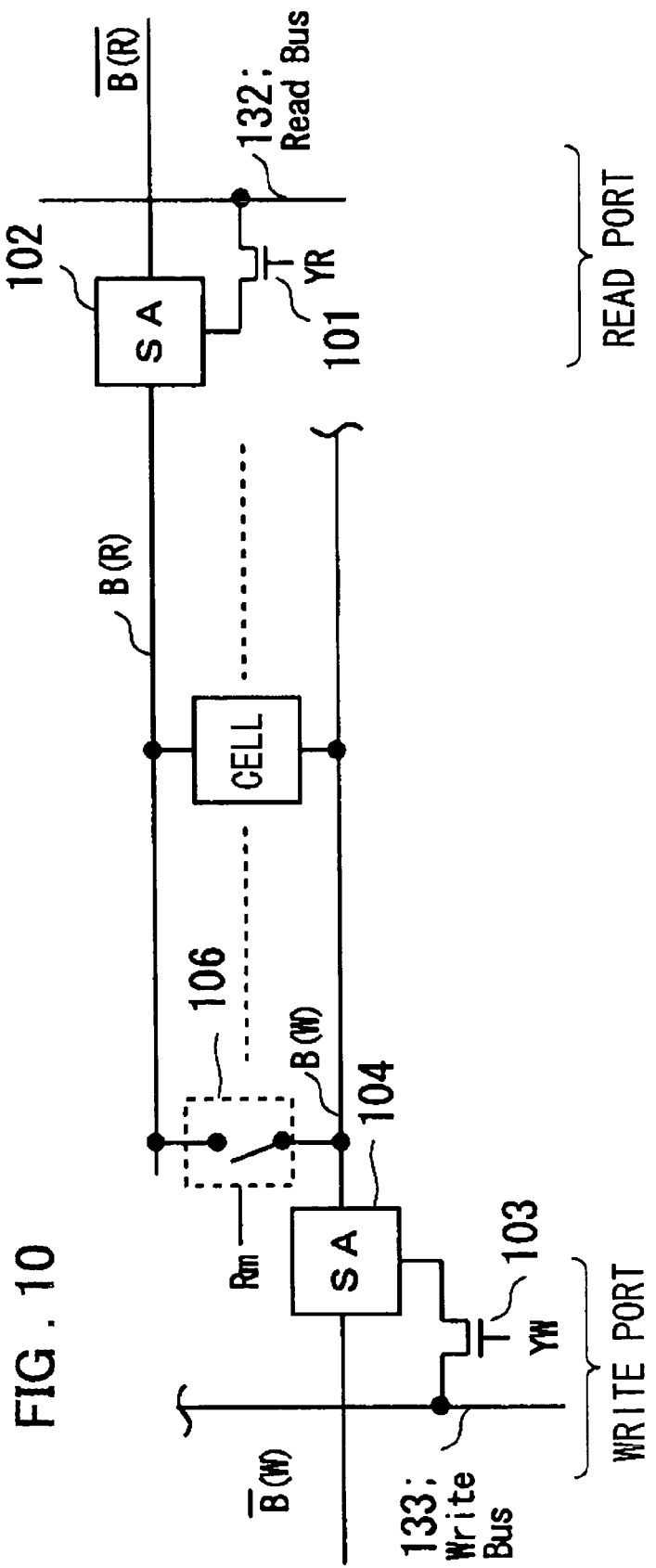
FIG. 10 is a diagram explaining a measure directed toward concurrent execution of a read and a write when the same word lines have been selected, in other embodiment of the present invention.

Next, a still further example of the measure when the row address for the read-system port matches the row address for the write port will be explained. FIG. 10 is a diagram showing a configuration of a still further embodiment. Referring to FIG. 10, in the present embodiment, a switch 106 is inserted between the bit line B(R) for the read-system port and the bit line B(W) for the write-system port. When the row address for the read-system port matches the row address for the write-system port, the bit line B(R) for the read-system port and the bit line B(W) for the write-system port are conducted by turning on the switch 106. Data written to the cell from the write bus through the write system bit line B(W) is transferred to the read bus through the bit line B(R) for the read system port, a sense amplifier 102, and a Y switch 101. A write signal from the write bus can readily invert the value of the sense amplifier 102 for the read-system port (provided that the write data is different from data held in the cell).

Figure 11:
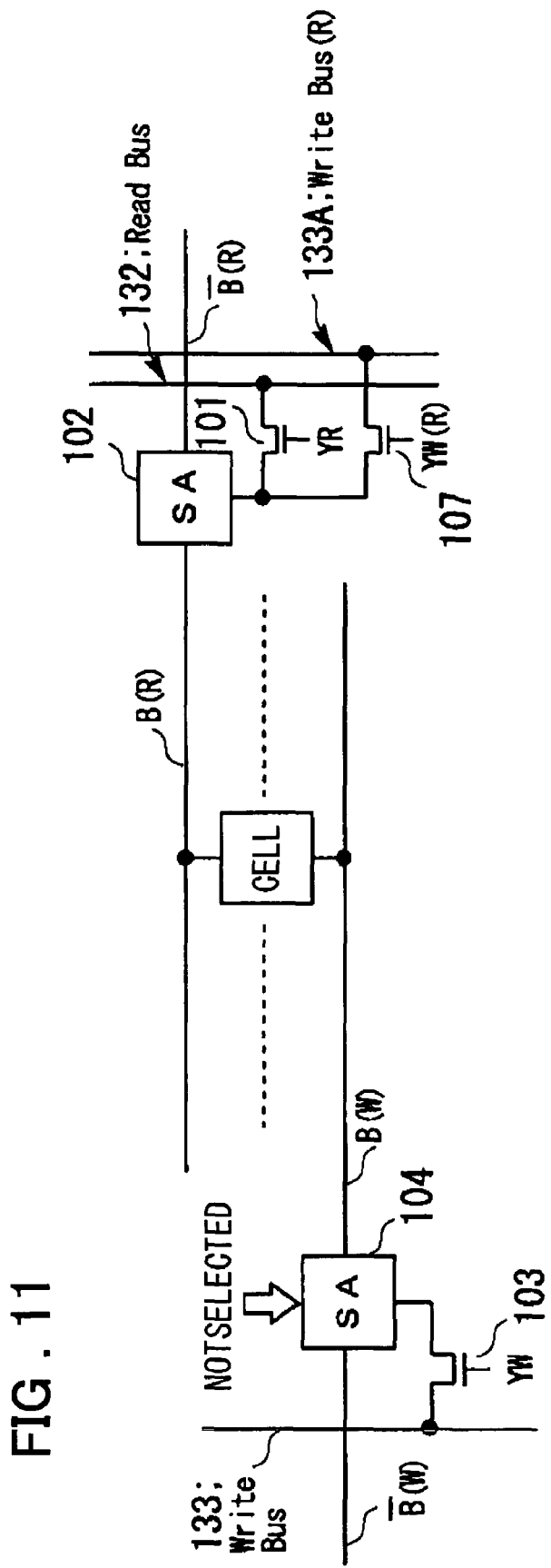
FIG. 11 is a diagram explaining a measure directed toward concurrent execution of a read and a write when the same word lines have been selected, in other embodiment of the present invention.

Next, a still further example of the measure when the row address for the read-system port matches the row address for the write port will be explained. FIG. 11 is a diagram showing a configuration of a still further embodiment of the present invention. Referring to FIG. 11, in the present embodiment, when the row address for the read-system port matches the row address for the write-system port, data is written using a dedicated write bus (R) 133A for the write-system port, provided in juxtaposition with the read bus 132 on the side of the read-system port and a Y switch 107.

The Y switch 107 is turned on when the column selection signal YW(R) for the write-system port is high.

When the row address for the read-system port matches the row address for the write-system port, the ordinary sense amplifier 104 on the side of the write port is deactivated. The selected word line on the side of the write-system port as well is not selected (the selected word line XW1 is made low). Since only the sense amplifier on the side of the read-system port is activated, collision between writing to the cell by the sense amplifier for a write and reading of data by the sense amplifier for a read will not occur.

Data may also be written to the cell using a dedicated read-system port (including a read bus (W) and a switch) provided on the side of the write-system port. That is, referring to FIG. 11, the read-system port is exchanged with the write-system port. The dedicated read bus (not shown) for the write-system port is provided in juxtaposition with the write bus 133 for the write system, and a second Y switch for the read system, which is turned on and off according to the column selection signal (YR) and connected between the sense amplifier 104 for the write system and the dedicated read bus on the side of the write-system port is provided for the sense amplifier 104 for the write system to which the Y switch 103 for the write system is connected. The switch 107 in FIG. 11 is connected between the dedicated read bus (not shown) and the sense amplifier 104. When the row address of an address selected through the read-system port and the row address of an address selected through the write-system port match each other, it is so configured that the first sense amplifier activation signal SER is deactivated, thereby deactivating the sense amplifier for the read system, and then, through the write bus 133, the Y switch 103 for the write system, and the sense amplifier 104 for the write system of the write system port, data is written to the cell. It is also configured that data reading is performed through the sense amplifier 104 for the write system, the second Y switch (not shown) for the read system, and the dedicated read bus. It is so configured that collision between writing to the cell by the sense amplifier for the write system and reading from the cell by the sense amplifier for the read system will not occur.

Figure 12:
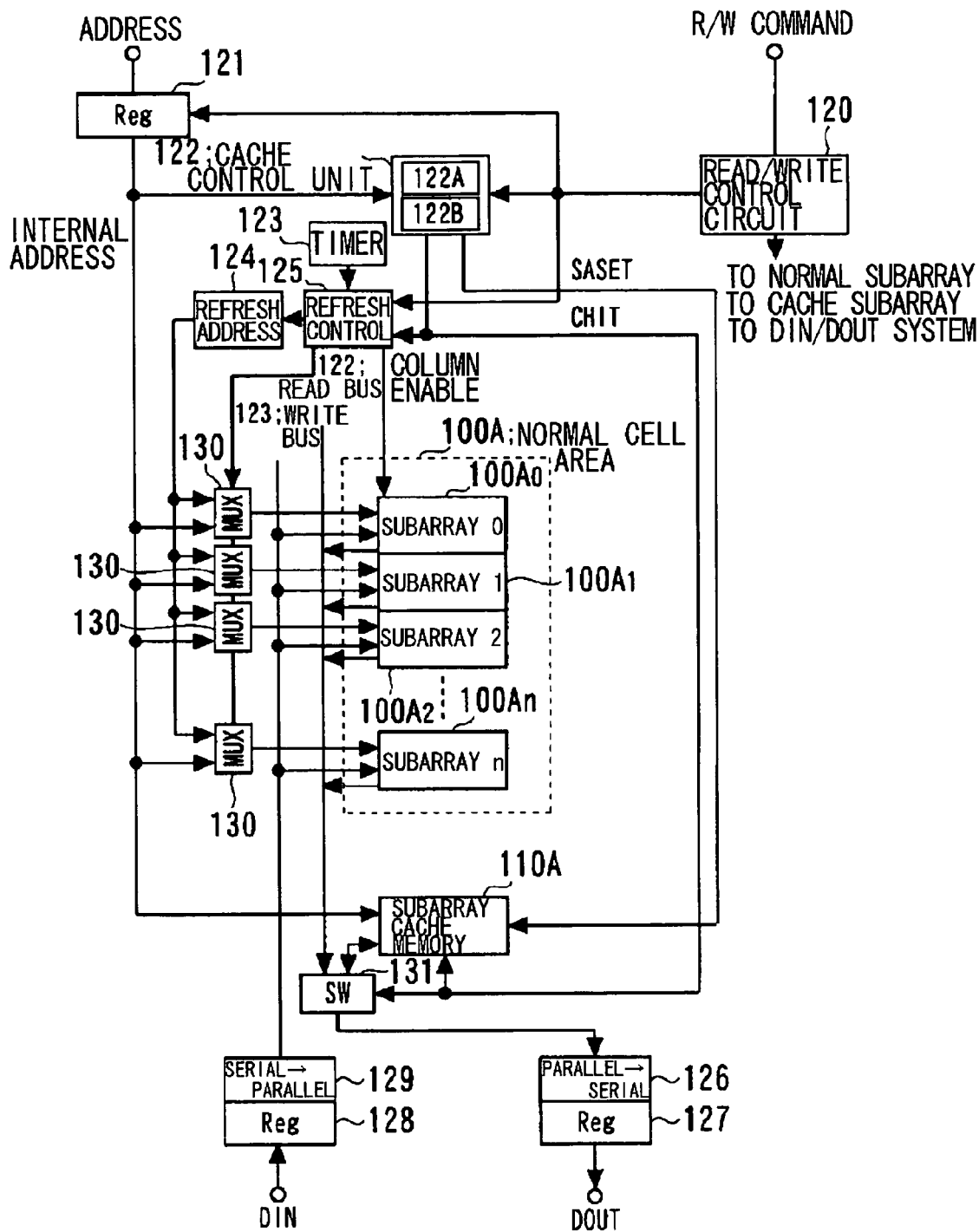
FIG. 12 is a diagram showing a cell array of a semiconductor memory device according to another embodiment of the present invention and the entire semiconductor memory device.

Next, a still further embodiment of the present invention will be described. FIG. 12 is a diagram showing a configuration of a sixth embodiment of the present invention. Referring to FIG. 12, in this embodiment, an internal core cell in the SRAM compliant with the QDR specification is constituted from one transistor and one capacitor. Differing from the embodiment shown in FIG. 1, a subarray 110A has one port. Though the configuration in this embodiment cannot accommodate a higher speed than the configuration in FIG. 1, it contributes to reduction in chip area. The chip area is reduced to approximately one tenth of that of the SRAM, and is reduced to approximately a half of that of the configuration in FIG. 1.

Figure 13:
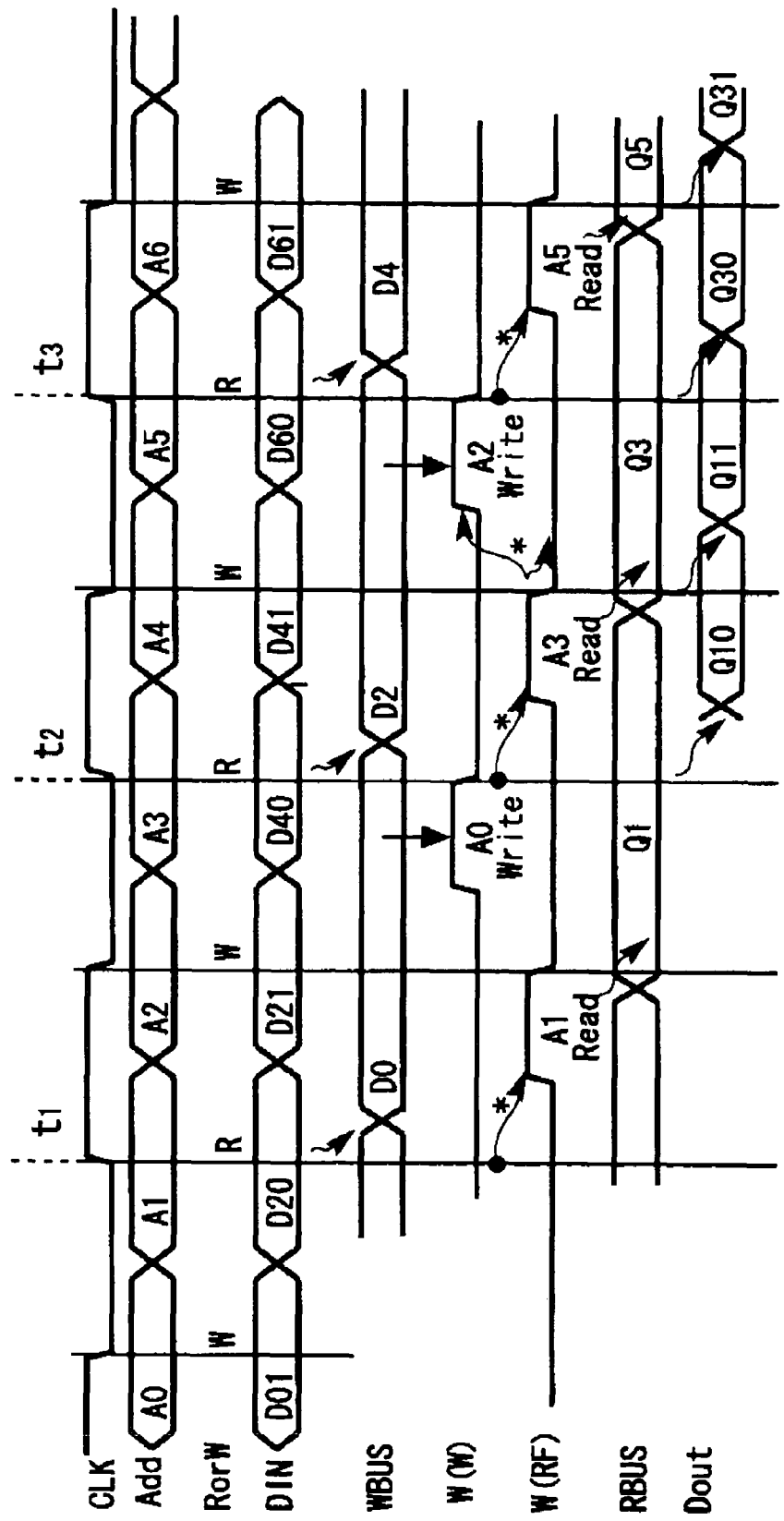
FIG. 13 is a timing diagram for explaining an operation in connection with FIG. 12.

FIG. 13 is a diagram showing an operation of the embodiment illustrated in FIG. 12. A read and a write are alternately performed, each using a half period of the clock signal CLK for synchronization. In this embodiment as well, when there is data in the cache memory at the time of the read from the address A3, data is read from the cache memory and refreshing of the associated subarray is performed.

Next, the case where continuous, alternate read and write accesses are made to the same subarray will be described. In this case, the cache memory 110 is disposed for each subarray, which means that a plurality of cache memories being included therein, and data is stored in the cache memory 110 for a write operation. When a cache hit is not found at the time of a read operation, data read from the subarray is stored in the cache memory.

Further, the tag storing unit 122A is provided for each subarray. When continuous accesses are made to the same subarray, a read address is monitored. When a cache hit has been found, a changeover to refreshing of the cell array core of the subarray is made.

When the number of addresses in a subarray is set to m, the period of the clock signal CLK is set to tCK, and a data holding (retention) period is set to $t_{hold}$, it may be arranged so that $$2(tCK \times 2^m) < t_{hold} \text{ for QDR burst 4, and}$$

$$tCK \times 2^m < t_{hold} \text{ for QDR burst 2.}$$

By the settings described above, even if the semiconductor memory device of the present invention is configured using a one-port DRAM array, continuous read/write operations can be achieved, with the cache superficially hidden. QDR SRAM compatibility can be thereby achieved.

Though the QDR memory described above is a memory in which one read and one write are alternately executed, the present invention is not limited to the QDR type memory. An example where the present invention has been applied to a memory in which a read is periodically executed will be described as a still further embodiment of the present invention. The configuration of this embodiment is basically the same as the configuration shown in FIG. 1. While a read command and a write command are alternately supplied to the read/write control circuit 120 in the embodiment shown in FIG. 1 and described before, the read command is periodically supplied to the read/write control circuit 120 in this embodiment. When a read request has been made to a memory cell in a subarray specified by an external address signal (among the subarrays $100_0$ to $100_n$ in FIG. 1) and when data stored in the memory cell to which the read request has been made is stored in the cache memory 110, i.e., when the cache hit signal CHIT output from the cache control unit 122 is active, the data is read from the cache memory 110, and refreshing of the subarray associated with the refresh address generated by the refresh address generation circuit 124 is performed. In this manner, in this embodiment, a read from the cache memory and refreshing of the memory cell are performed at a timing of the read periodically performed. In the memory compliant with the specifications of a two-read and two-write cycles and a one-read and two-write as well, cache reading and a refresh operation according to the present invention can be applied in a periodically introduced read cycle.

The present invention has been described in connection with the above embodiments. The present invention, however, is not limited to the configurations of the embodiments described above, and includes various variations and modifications that would be made by those skilled in the art within the scope of the inventions in the respective claims.

The meritorious effects of the present invention are summarized as follows.

As described above, according to the present invention, it is arranged that a cache memory is provided for a memory cell array of DRAM cells, and control is performed so that refreshing of the memory cell array is performed concurrently with data reading from the cache memory. Occurrence of a wait due to a refresh operation when periodic read access is made, when continuous alternate read and write accesses are made, and the like is thereby eliminated. High-speed access compliant with the QDR SRAM specifications, for example, can be thereby achieved.

According to the present invention, a word line is selected over a plurality of internal clock cycles, and a read and a write are concurrently executed. A timing margin is thereby relaxed, thereby allowing the semiconductor memory device of the present invention to accommodate an SRAM-compatible faster operation.

According to the present invention, when a row address for the read-system port matches a row address for the write-system port, a collision between writing to a cell and data restoration by the read system amplifier is avoided. Reliability of an operation is thereby ensured.

Further, according to the present invention, a subarray is composed by DRAM cells, each having one transistor per cell, and the cache memory is provided for each subarray. The present invention can thereby accommodate continuous alternate read and write accesses while hiding a refresh operation, so that the invention achieves compatibility with the high-speed QDR and SRAM specification.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
a cell array including a plurality of dynamic memory cells;
a cache memory;
a read bus interconnecting said cell array and said cache memory to an output port, said read bus permitting data to be selectively provided to said output port from either of said cell array and said cache memory;
a control circuit performing control so that, if at a time of a read operation, data to be read from said cell array is present in said cache memory, the data is read from said cache memory and refreshing of said cell array is performed;
a plurality of subarrays each having a plurality of dynamic memory cells provided in a region of said cell array;
at least one cache memory provided for said plurality of subarrays as said cache memory; and
a circuit receiving a read request to a subarray for determining whether data to be read from the subarray is present in said cache memory or not, based on a read address, and performing control so that when the data to be read from the subarray is present in said cache memory, the reading of the data from said cache memory and refreshing of the subarray are performed concurrently,
wherein at least one of said subarrays has two ports for a read system and a write system,
wherein each of said dynamic memory cells composing said subarray comprises:
two transistors connected between a bit line for a read system and a bit line for a write system; and
a capacitor element connected between a connecting point between the two transistors and a ground, control terminals of the two transistors being connected to a word line for said read system and a word line for said write system, respectively, and
wherein said subarray comprises:
a first row decoder for said port for said read system, for decoding either of a row address of the read address and a refresh address;
a second row decoder for said port for said write system, for decoding a row address of a write address;
outputs of said first row decoder and outputs of said second row decoder being connected to the word lines for said read system and the word lines for said write system, respectively;

a plurality of sense amplifiers for said read system, each connected respectively to an associated bit line for said read system, activation of said sense amplifiers being controlled by a first sense amplifier activation signal;

a plurality of Y switches for said read system, each connected respectively to a corresponding one of said sense amplifiers for said read system and a read bus constituting a transfer path for read data, said Y switches being controlled to be on and off according to a column selection signal from a column decoder for said read system;

a plurality of sense amplifiers for said write system, each connected respectively to a corresponding bit line for said write system, activation of said sense amplifiers for said write system being controlled by a second sense amplifier activation signal; and a plurality of Y switches for said write system, each connected respectively between a corresponding one of said sense amplifiers for said write system and a write bus constituting a transfer path for write data, said Y switches being controlled to be on and off according to a column selection signal from a column decoder for said write system.

2. The semiconductor memory device according to claim 1, wherein said column decoder for said read system and said column decoder for said write system are provided in common to said plurality of subarrays.

3. The semiconductor memory device according to claim 1, wherein said Y switch for said read system comprises an amplification circuit, activation of said amplification circuit being controlled by the column selection signal from said column decoder for said read system, said amplification circuit receiving the bit line for said read system and having an output connected to said read bus; and wherein when a row address of an address selected through the port for said read system and a row address of an address selected trough the port for said write system match each other and when a selected word line for said read system and a selected word line for said write system are activated, the second sense amplifier activation signal is activated and the first sense amplifier activation signal remains deactivated; and said Y switch for said read system and said Y switch for said write system are turned on by the column selection signals from said column decoder for said read system and said column decoder for said write system.

4. The semiconductor memory device according to claim 1, wherein, in a case that a row address of an address selected through the port for said read system and a row address of an address selected Through the port for said write system match each other, when a selected word line for said read system and a selected word line for said write system are activated, the column selection signal for said write system is activated at a timing simultaneous with or subsequent to a rising transition of said word lines to turn on a corresponding Y switch for said write system, then said sense amplifiers for said write system are activated by activating the second sense amplifier activation signal;

said sense amplifier for said read system is activated by activating the first sense amplifier activation signal to turn on a corresponding Y switch for said read system by activating the column selection signal for said read system; and after data is written in the memory cell selected by an address input through said write-system port, data is read from the memory cell selected by an address input through said read-system port.

5. The semiconductor memory device according to claim 1, wherein a switch is provided between the bit line for said read system and the bit line for said write system, said bit lines for said read and write systems connected to the same memory cell, and wherein, when a row address of an address selected through the port for said read system and a row address of an address selected through the port for said write system match each other, said switch provided between the bit line for said read system and the bit line for said write system corresponding to said addresses is turned on and data to be output to the bit line for said write system from said write bus through said Y switch for said write system and said sense amplifier for said write system is transferred to the bit line for said read system through the switch in an on state and supplied to said sense amplifiers for said read system.

6. The semiconductor memory device according to claim 1, further comprising:

a dedicated write bus arranged on a side of the port for said read system in juxtaposition with said read bus for the port for said read system; and a plurality of second Y switches for said write system, each controlled to be switched on and off according to the column selection signal output from said column decoder for said write system and provided for each of said sense amplifiers for said read system, said sense amplifier being connected to said read bus via said Y switch for said read system, said second Y switch being connected between the associated sense amplifiers for said read system and said dedicated write bus for the port for said read system; wherein when a row address of an address selected through the port for said read system and a row address of an address selected through the port for said write system match each other, the second sense amplifier activation signal is deactivated, thereby deactivating said sense amplifier for said write system, and data is written into a selected memory cell through said dedicated write bus for the port for said read system, the second Y switch for said write system, and said sense amplifier for said read system, while data reading is performed through said sense amplifier for said read system, said Y switch for said read system, and said read bus.

7. The semiconductor memory device according to claim 1, further comprising:

a dedicated read bus for the port for said write system provided in juxtaposition with said write bus for the port for said write system; and a plurality of second Y switches, each controlled to be switched on and off according to the column selection signal output from said column decoder for said read system and provided for each of said sense amplifiers for said write system, said second Y switches being connected between said sense amplifiers for said write system and said dedicated read bus for the port for said write system, said Y switches for said write system being connected to said sense amplifiers for said write system; wherein when a row address of an address selected through the port for said read system and a row address of an address selected through the port for said write system match each other, the first sense amplifier activation signal is deactivated, thereby deactivating one of said sense amplifiers for said read system; and data is written through said write bus, said Y switch in an on state for said write system, and said sense amplifiers for said write system of the port for said write system, while data reading is performed through said sense amplifiers for said write system, said second Y switch for said read system in an on state, and said dedicated read bus.

8. A semiconductor memory device comprising:

a cell array including a plurality of dynamic memory cells;

a cache memory;

a read bus interconnecting said cell array and said cache memory to an output port said read bus permitting data to be selectively provided to said output port from either of said cell array and said cache memory;

a control circuit performing control so that, if at a time of a read operation, data to be, read from said cell array is present in said cache memory, the data is read from said cache, memory and refreshing of said cell array is performed;

a plurality of subarrays each having a plurality of dynamic memory cells provided in a region of said cell array;

at least one cache memory provided for said plurality of subarrays as said cache memory;

a circuit receiving a read request to a subarray that determines whether data to be read from the subarray is present in said cache memory or not, based on a read address, and performing control so that when the data to be read from the subarrary is present in said cache memory, the reading of the data from said cache memory and refreshing of the subarray are performed concurrently;

a tag storing unit that holds tag address information on an address at which data is written in said cache memory, wherein, when a write access is made, data is written in a memory cell of a subarray selected by a write address and the data is also written at a location of said cache memory corresponding to the write address, and tag address information on the write address is held in said tag storing unit;

a cache control unit including a comparator that determines whether a tag address of a read address matches tag address information stored in said tag storing unit when a read access is made, outputting a cache hit signal in an active state if a match is found, and outputting the cache hit signal in an inactive state if a mismatch is found; and a switch circuit, having first and second terminals connected to a first transfer path that transfers the data read from said subarray and a second transfer path that transfers the data read from said cache memory, respectively, and a control terminal that receives the cache hit signal output from said cache control unit and selecting said second transfer path to output from an output terminal thereof the data read from said cache memory as read data when the cache hit signal is in said active state;

a serial-to-parallel converter circuit that respectively receives or outputs two data elements per clock cycle through a data input terminal thereof or a data output terminal thereof, using rising and falling edges of a clock signal, converts a plurality of data elements input serially to parallel data elements to supply said parallel data elements to said write bus; and a parallel-to-serial converter circuit that converts parallel data elements read onto said read bus to serial data elements in synchronization with the clock signal.

* * * * *